United States Patent [19]
McCann

[11] Patent Number: 5,930,113
[45] Date of Patent: Jul. 27, 1999

[54] HOUSING FOR ELECTRONIC DEVICES INCLUDING INTERNAL FINS FOR VOLUMETRIC COOLING

[75] Inventor: Andrew F. McCann, Suwanee, Ga.

[73] Assignee: Scientific-Atlanta, Inc., Norcross, Ga.

[21] Appl. No.: 08/657,200

[22] Filed: Jun. 3, 1996

[51] Int. Cl.⁶ .................................................. H05K 7/20
[52] U.S. Cl. ........................ 361/704; 361/688; 361/690
[58] Field of Search .................... 361/688–695, 361/701–704, 707, 730

[56] References Cited

U.S. PATENT DOCUMENTS

| | | | |
|---|---|---|---|
| 3,264,526 | 8/1966 | Wiggerman | 317/101 |
| 3,317,798 | 5/1967 | Chu et al. | 361/701 |
| 4,535,386 | 8/1985 | Frey, Jr. et al. | 361/690 |
| 4,656,559 | 4/1987 | Fathi | 361/386 |
| 5,065,278 | 11/1991 | Schultz | 361/688 |
| 5,089,935 | 2/1992 | Ito | 361/383 |
| 5,267,122 | 11/1993 | Glover et al. | 361/704 |
| 5,343,361 | 8/1994 | Rudy, Jr. et al. | 361/710 |
| 5,369,552 | 11/1994 | Barnes et al. | 361/688 |

*Primary Examiner*—Gregory D. Thompson
*Attorney, Agent, or Firm*—Kenneth M. Massaroni; Kelly A. Gardner

[57] ABSTRACT

A housing for heat emitting components includes a housing body and a housing cover. The housing cover includes an interior portion occupied by the heat emitting components when the housing body engages the housing cover, and a volumetric cooling element including a plurality of internal fins arranged to occupy a volume adjacent to the interior portion of the housing cover when the housing body engages the housing cover, wherein the internal fins volumetrically cool the volume.

6 Claims, 3 Drawing Sheets

HOUSING FOR ELECTRONIC DEVICES INCLUDING INTERNAL FINS FOR VOLUMETRIC COOLING

FIELD OF INVENTION

The invention generally relates to a housing for electronic components which includes internal fins for dissipating heat generated by the components. More particularly, the present invention is directed to a housing including a housing body and a housing cover having internal fins for volumetric cooling of a volume within the housing.

BACKGROUND OF INVENTION

Conventional housings for elements such as cable television transmission circuitry are designed to handle temperatures up to 50 degrees Celsius. Most conventional housings have only external fins located on an exterior portion of a cast aluminum housing structure to dissipate heat generated by the electronic components housed therein. This has proven effective to cool components directly mounted on the inside surface of the housing, wherein the heat they generate radiates through the cast aluminum and out to the external environment. However, not all parts can be mounted directly to the housing, such as AC bypass coils. These parts dissipate their heat to the surrounding air inside the housing. Thus, the temperature of the air becomes substantially higher than the outside air temperature. High temperatures inside the housing can damage heat sensitive components such as fiber optic components.

Thus, a problem exists in that heat builds up in the sealed, moisture proof, airtight housings, which may be underground, mounted above ground on walls, poles or pedestals, or strand-mounted, suspended from an overhead cable. Accordingly, there is a need to develop a more efficient cooling method, to conduct heat from inside the housing to the outside environment, where it can be dissipated. Fans have been implemented inside the housing to cool the environment. However, fans take up space in the housing and require power. Further, fans generate heat which also must be accounted for inside the housing.

U.S. Pat. No. 5,267,122 to Glover et al. discloses a technique for conducting heat to the outside environment. In particular, Glover et al. provides internal fins each protruding from the housing into its hollow interior, adjacent to printed circuit cards to promote heat dissipation from the cards via the internal fins to the exterior walls of the housing for cooling by external cooling fins exposed to the outside environment. Adjacent fins are dedicated to a particular circuit board inserted therebetween and consequently only assist in cooling the dedicated circuit board therebetween. The heat generated by circuit boards and electronic components can vary significantly from component to component. Thus, it is inefficient to dedicate only two internal fins to cooling a particular circuit board.

SUMMARY OF THE INVENTION

The present invention provides a housing for electronic components which enhances dissipation of heat generated by the components. The internal structure of the housing provides internal fins used for volumetric cooling to achieve enhanced dissipation of heat. Rather than dedicating internal fins to cooling a specific component, the internal fins occupy a volume adjacent to an interior portion of the housing cover where the heat emitting components are located. Consequently, the internal fins lie above the electronic components and convect, wherein the cool air between the internal fins flows toward and cools the electronic components, while the heat from these components flows between the fins. The internal fins then radiate the heat through the housing to the outside to dissipate heat.

The present invention can be employed in an operating environment for cable television transmission products, where the air temperature can reach 60 degrees Celsius or more.

BRIEF DESCRIPTION OF THE DRAWINGS

The present invention will now be described in more detail with reference to preferred embodiments of the invention, given only by way of example, and illustrated in the accompanying drawings in which.

DETAILED DESCRIPTION

The present invention is discussed below with reference to a housing employed in a cable television system. However, the present invention may be extended to other high temperature applications where cooling and heat dissipation are a concern.

In a cable television system, information is transmitted from a headend to remote subscribers using cables, typically fiber optic or coaxial cables. The transmission path between the headend and the subscribers is generally of a length that signals communication therebetween must be amplified or repeated. Nodes are located on the path between the headend and remote subscribers having amplifiers or repeaters so that the transmitted signals can be received successfully. The nodes include amplifier and repeater circuitry in sealed, moisture proof, airtight housings, which may be underground, mounted above ground on walls, poles or pedestals, or strand-mounted, suspended from an overhead cable. The amplifier and repeater circuitry components, and other accompanying electronic circuitry emit heat when operative causing heat to build up in the housing.

Figure 1A:
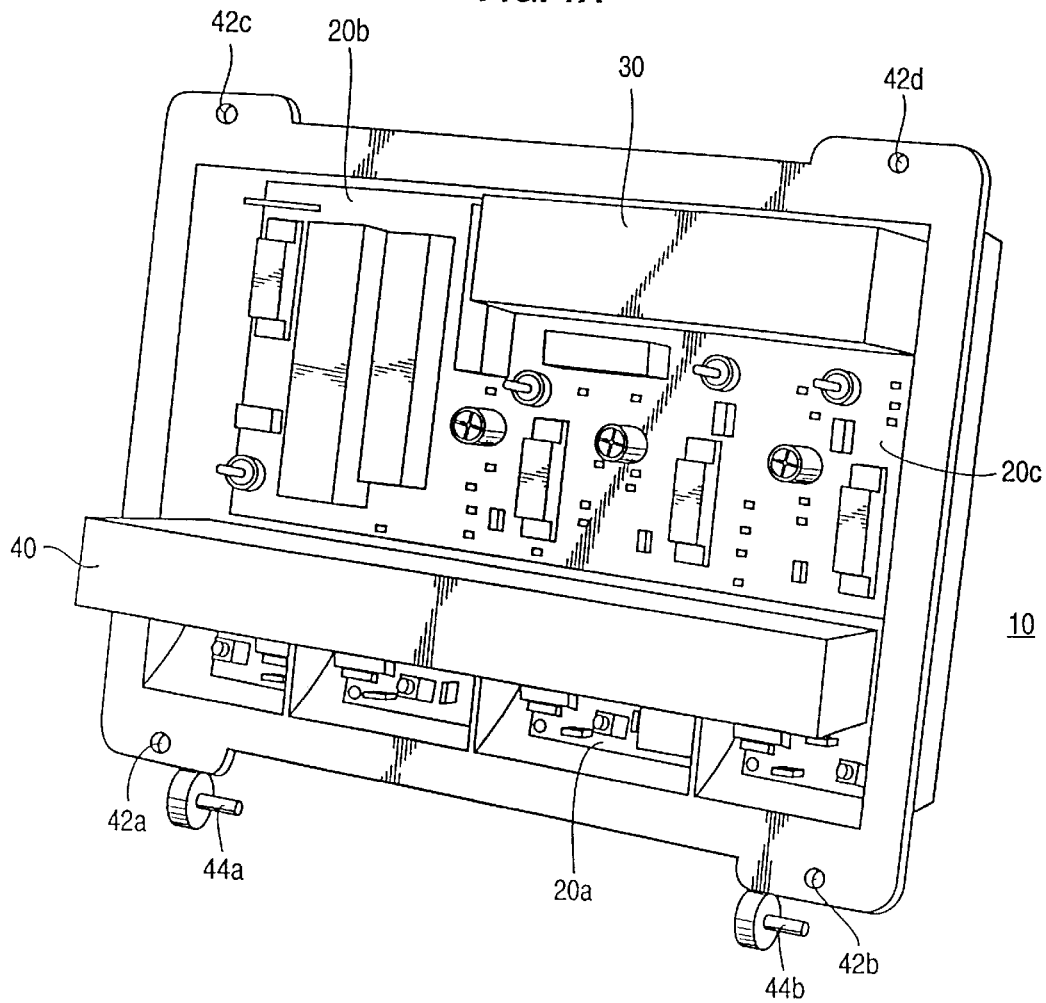
FIG. 1A shows the inside of a bottom or body portion of an illustrative housing according to the present invention.

The present invention will be described in more detail below with reference to FIGS. 1A, 1B, and 1C which show an illustrative housing for housing amplifier and repeater circuitry for use in a cable television system. FIG. 1A depicts an exemplary housing body or bottom portion 10 of a housing according to the present invention. Electronic circuitry sections 20a, 20b, and 20c are disposed in the housing body 10 as shown. Also, a power supply 30 for providing power to the electronic circuitry sections 20a, 20b, and 20c and a plug-in-module 40 are disposed in the housing body 20 and connected to the electronic circuitry sections 20a, 20b, and 20c.

The plug-in-module 40 disposed in the housing body 10 is electrically coupled to electronic circuitry sections 20a, 20b, and 20c. Also, the plug-in-module 40 includes connectors for engagement with one or more transmission cables through openings in the housing body 10 and/or openings 56a, 56b, 56c in the housing cover 50 shown in FIG. 1C. Types of plug-in-modules are described in a commonly assigned, copending application entitled "Reconfigurable Node For a Communications Network", Ser. No. 08/657, 205, and incorporated herein by reference. The plug-in-module 40 is a circuit board, plugged into a motherboard, that is removable from the housing body 10 and can provide various types of transmission functionality. For example, the node can be configured to have one or two optical receivers or one or two reverse amplifiers.

The housing body 10 includes four holes 42a, 42b, 42c, 42d on the periphery of the housing body for engagement with four corresponding holes 52a, 52b, 52c, 52d on the housing cover 50. Screws are used to fasten the housing cover 50 to the housing body to create a substantially airtight, moisture-free seal. Other means for coupling the cover and body together may be used as long as the interior regions of the housing body and cover are not exposed to dust or moisture which can cause short circuits. The housing includes a hinge mechanism having two hinge portions 44a, 44b on the housing body 10 and two hinge portions 54a, 54b on the housing cover for engagement with each other. When the hinge mechanism is connected and the housing body 10 and housing cover 50 are not sealed together, the cover 50 may be pivoted around the hinge mechanism to move the cover from a closed position to an open position. In an open position, the plug-in-module 40 may be removed and replaced. When the cover 50 and body 10 are coupled together to form a seal, the hinge mechanism is in the closed position.

Figure 1B:
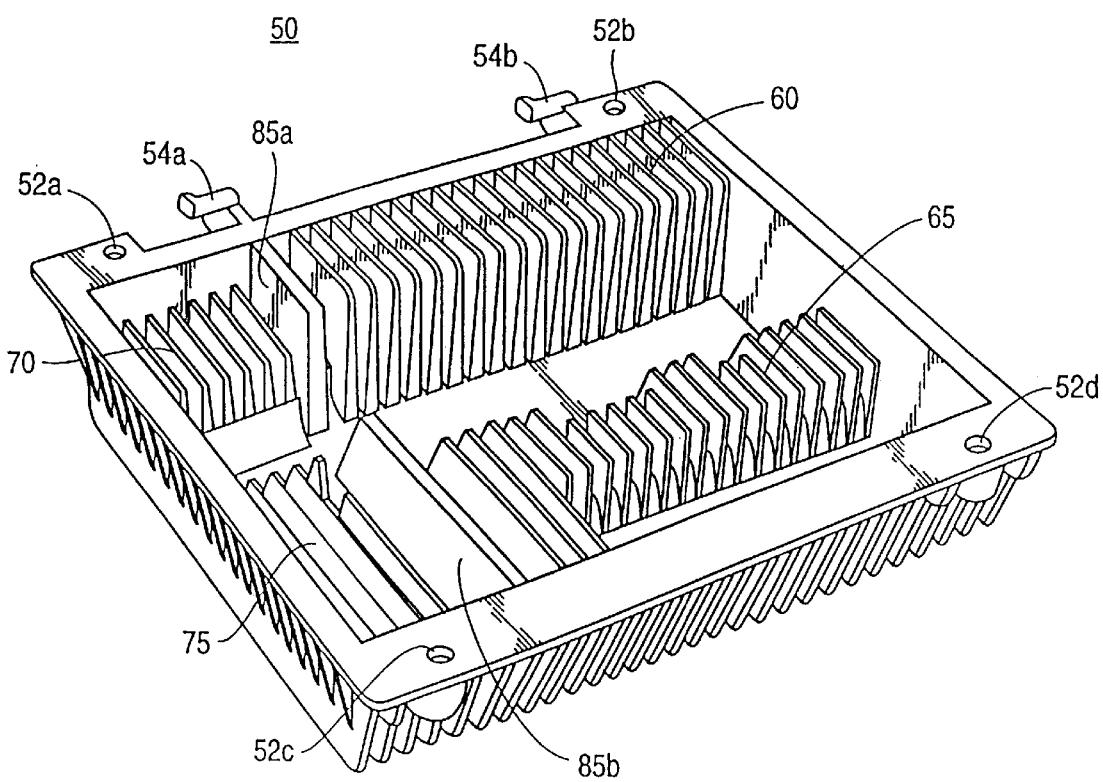
FIG. 1B shows the inside of a top or cover portion of an illustrative housing for use with the bottom portion of the illustrative housing of FIG. 1A.
Figure 1C:
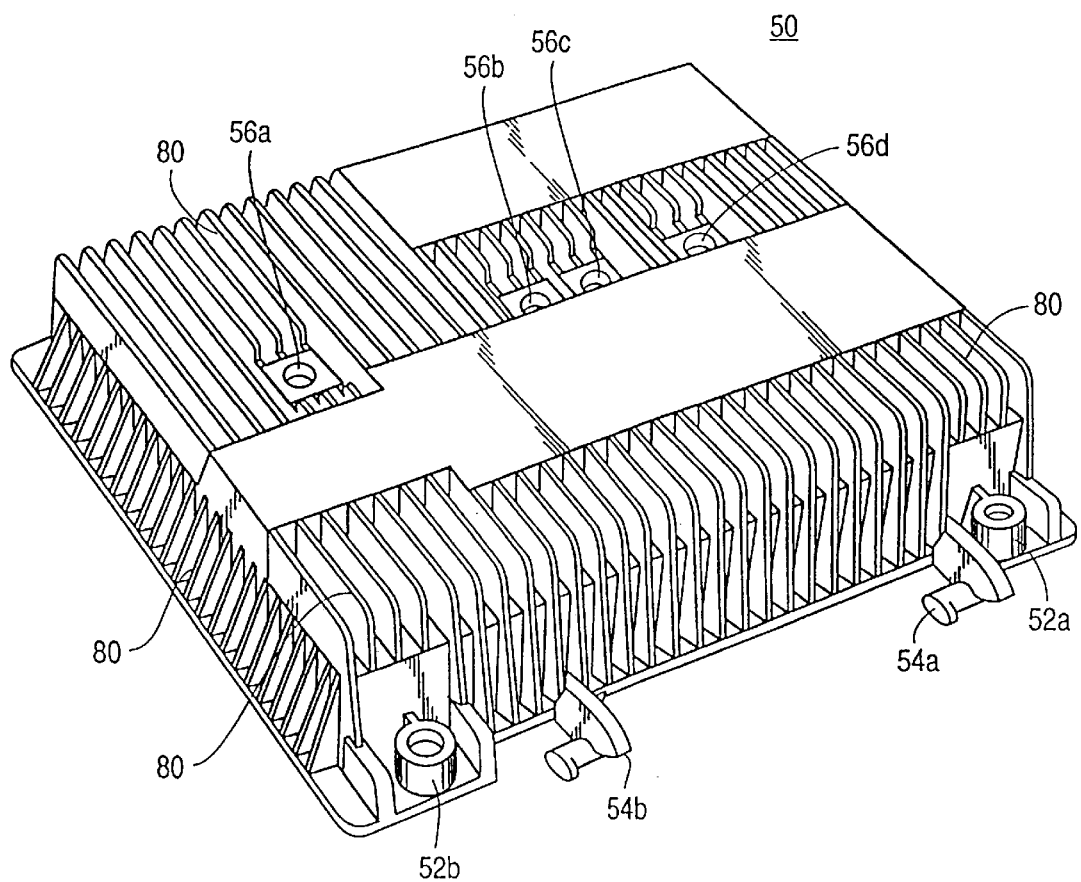
FIG. 1C shows the outside of a top or cover portion of the top or cover portion of FIG. 1B.

A view of the inside of the housing cover 50 is shown in FIG. 1B and a view of the outside of the housing cover 50 is shown in FIG. 1C. The housing cover 50 and the housing body 10 are both made of a heat conductive material. The housing cover 50 is removably engageable with the housing body 10, as described above. An interior portion of the housing cover 50 is occupied by heat emitting components, such as the plug-in-module 40, the power supply 30, and/or electronic circuitry sections 20a, 20b, 20c, when the housing body 10 engages the housing cover 50.

Volumetric cooling elements 60, 65, 70, 75 including a plurality of internal fins are arranged to occupy a volume adjacent to the interior portion of the housing cover 50 when the housing body engages the housing body 10. The internal fins of each volumetric cooling element 60, 65, 70, 75 volumetrically cool the volumes proximate to the electronic circuitry sections 20a, 20b, 20c, power supply 30, and plug-in-module 40. Heat transfer occurs when cool air between the internal fins is exchanged with hot air immediately above and proximate to the heat emitting elements. Thus, convection removes hot air immediately above and proximate to the electronic circuitry sections 20a, 20b, 20c, power supply 30, and plug-in-module 40. The object of the internal fins is to increase the available surface area so that more heat conducting surface is available to create convective heat dissipating currents within the volume that the fins occupy. However, adjacent internal fins must have a sufficient space therebetween to allow convection. Typically, the internal fins will extend in a vertical plane to promote convection because hot air rises and cool air flows below down. It is envisioned that the fins may also extend in other non-vertical planes, with reduced effectiveness. It may be convenient, e.g., for spacing, to have the fins in a non-vertical direction. Also, a source of cool air temperatures may be proximate to a side wall of the housing cover. In this instance, to maximally utilize the cool air temperatures, the fins may be arranged in a non-vertical plane. For the purposes of this description, it is understood that fins include any geometry that is used to increase the surface area on the inside of the housing cover 10 including, but not limited to, round pins, rectangular pins, ribs, septums, walls, bumps, dents, or any other shaped protrusion from the inside surface.

The hot air transferred to the volumetric cooling elements 60, 65, 70, 75 is conducted by the heat conductive material of the housing cover 50 including the internal fins and external fins 80. The external fins 80 receive the heat conducted through the housing cover 50 and dissipate the heat in the cooler external environment. The external fins may be arranged in any direction on the exterior portion of the cover.

A pair of internal isolator fins 85a, 85b each divide the interior portion of the housing cover 50 into two thermally isolated regions on opposing sides of the fins. For example, isolator fin allows volumetric cooling element 70 to primarily cool elements immediately proximate to the volume above the volumetric cooling element 70 rather than contribute to cooling elements immediately proximate to the volume above volumetric cooling elements 60 and 65. An isolator fin may be used to separate elements which require more or less cooling from each other to achieve enhanced cooling efficiency.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A three-dimensional housing cover made of heat conductive material, said housing cover being removably engageable with a housing body containing a heat emitting component, said housing cover comprising:

plural sides, said sides defining an inner space, said inner space comprising first and second portions, wherein the first portion of said inner space is configured to be occupied by said heat emitting component when said housing body engages said housing cover; and a volumetric cooling element comprising a plurality of internal fins, wherein said internal fins are disposed on at least one of said sides of said housing cover and arranged to occupy the second portion of said inner space, and wherein said internal fins are configured to volumetrically cool at least the second portion of said inner space.

2. The housing cover according to claim 1, further comprising an outside cover portion including a plurality of external fins for dissipating heat, wherein said external fins are disposed outside of said inner space.

3. The housing cover according to claim 1, wherein said housing cover is configured to form an air tight, moisture proof seal with said housing body when said housing cover is engaged with said housing body.

4. A housing for use in a node in a transmission path of a cable television system, said housing comprising:

a body;

a heat emitting component disposed in an interior portion of said body;

a three-dimensional cover, said cover being removably attachable to said body for covering said interior portion of said body when in a closed position, said cover including plural sides, said sides defining an inner space, said inner space comprising first and second portions, wherein the first portion of said inner space is configured to be occupied by said heat emitting component when said housing cover is in a closed position, and a volumetric cooling element including a plurality of internal fins, said internal fins being disposed on at least one of said sides of said housing cover and arranged to occupy the second portion of said inner space, said internal fins configured to volumetrically cool at least the second portion of said inner space.

5. The housing according to claim 4, wherein said housing is underground.

6. The housing according to claim 4, wherein said housing is suspended from an overhead cable.

* * * * *